United States Patent [19]

Fuka

[11] 4,374,425
[45] Feb. 15, 1983

[54] SINGLE ACTUATOR ELECTRONIC MINICOMPUTER

[76] Inventor: Louis R. Fuka, 2073 North Rd., Los Alamos, N. Mex. 87544

[21] Appl. No.: 173,701

[22] Filed: Jul. 30, 1980

[51] Int. Cl.³ .......................... G06F 3/02; G06F 15/02
[52] U.S. Cl. .................................... 364/709; 364/710
[58] Field of Search ............................... 364/709, 710

[56] References Cited

U.S. PATENT DOCUMENTS

| | | | |
|---|---|---|---|
| 3,852,952 | 12/1974 | Vittoz et al. | 364/709 X |
| 4,007,364 | 2/1977 | Ojima et al. | 364/705 |
| 4,044,242 | 8/1977 | Laesser | 364/709 |
| 4,120,040 | 10/1978 | Aihara | 364/709 |
| 4,202,038 | 5/1980 | Petersson | 364/709 |
| 4,272,826 | 6/1981 | Deutsch | 364/709 |

Primary Examiner—Jerry Smith
Attorney, Agent, or Firm—Larson and Taylor

[57] ABSTRACT

A single actuator electronic minicomputer comprises a display, an electronic sequencer for providing sequencing of the display through a plurality of characters representing both data and data operations, a digital calculator for processing data signals in accordance with data operator signals, and a single switch controlled by the operator of the device for, in a first state thereof, actuating the electronic sequencer so as to provide sequencing of the display and for, in a second state thereof, deactivating the sequencer to provide selection of a character and for causing entry of a digitally encoded signal representing the selected character into the calculator.

10 Claims, 7 Drawing Figures

SINGLE ACTUATOR ELECTRONIC MINICOMPUTER

FIELD OF THE INVENTION

The present invention relates to a single actuator electronic microcomputer or electronic calculator wherein a single actuator, e.g., a single key or push-button input is employed.

BACKGROUND OF THE INVENTION

The popularity of small hand, wristwatch and pen sized calculators has increased in recent years due to their portability. One of the most severe problems in miniaturizing such calculators has been the requirement for a plurality of push-button or input devices which can be conveniently used and maintained, and still provide rapid and reliable operation. Various attempts have been made to decrease the number and configuration of input buttons or keys, with the apparent minimum required being reduced to three or four, see U.S. Pat. No. 4,120,040 and U.S. Pat. No. 4,086,654. The past minimum number of four buttons is used to perform only the simplest arithmetic functions—addition, subtraction, multiplication and division. Other devices of interest employ a bezel type input (e.g., U.S. Pat. No. 4,019,037) or a rotary input (e.g. U.S. Pat. No. 4,044,242), or combination rotary input with a sliding integer scale (e.g. U.S. Pat. No. 4,007,364), or multiple input keys. These devices have proven to be complicated, slow and unwieldy, and require numerous parts.

SUMMARY OF THE INVENTION

In accordance with the invention, a single actuator minicomputer or calculator is provided which overcomes the disadvantages of the prior art. For the sake of convenience the invention will be referred to as having a "one button" input device although, as described below, many different forms of single actuator input devices can be employed. The calculator with a single button input device as provided in accordance with the invention has a small number of functioning parts and this can be readily made waterproof and dustproof. The calculator is easy to maintain, can be used by people who are severely handicapped, and overcomes the primary obstacle to calculator miniaturization, namely the need for a multiplicity of keys, buttons or other input devices.

Furthermore, the one button calculator of the invention is suited to performing more mathematical operations and more complicated operations than basic arithmetic operations including, for example, trigonometric, hyperbolic, and logarithmic operations and the like. Further, the one button calculator of the invention is also adaptable to operations requiring an alphabetic input such as language translation, memo writing, storage and calender operations. As noted above, the device is amenable to be used by severely handicapped people who have limited tactile functionality and could be used by those whose range of action is limited to what might be referred to as singular unitary direction motion such as persons who have only breath control and single eyelid blinking or single eyeball motion. The device of the invention has many other diverse applications because of its advantages regarding portability and miniaturization, as well as its capabilities with respect to being operated remotely, and its improved ruggedness and invulnerability to adverse environmental conditions resulting from having only one moving part. Furthermore, assembly and manufacturing costs of the device are also decreased as compared with prior art devices.

According to the invention, a single actuator electronic digital minicomputer or calculator device is provided which comprises a display, electronic sequencing means for providing sequencing of the display through a plurality of characters representing both data and data operations, a digital calculator means for processing data signals in accordance with data operator signals, and a single switch means controlled by the operator of the device for, in a first state thereof, actuating the electronic sequencing means so as to provide sequencing of the display and for, in a second state thereof, deactivating said sequencing means to provide selection of a said character and for causing entry of a digitally encoded signal representing the selected character into said calculator means.

In one embodiment, the electronic sequencing means comprises character generator means for, when actuated, generating a said plurality of characters on a continuous, cyclic basis. In this embodiment, the display comprises an electronic display means, responsive to the character generator means, for displaying said characters one at a time on a continuous cyclic basis when the character generator means is actuated. Advantageously, the calculator means includes a separate plural character display and the electronic display means includes a single character display disposed on said calculator device adjacent said plural character display. For example, this arrangement is particularly adapted to an embodiment, wherein the minicomputer or calculator is incorporated into a working instrument as referred to above.

In a second embodiment, the display comprises means providing a fixed permanent visual display of said plurality of characters and indicator means associated with each of the characters for indicating the selection of the characters. In this embodiment, the electronic sequencing means comprises means for actuating the indicator means in a predetermined sequence so as to provide sequencing of said characters. The characters are preferably arranged on one face of the device and the indicator means can advantageously comprise liquid crystal displays for, when activated, illuminating the characters associated therewith.

As noted above the device may comprise a single mechanical actuator for actuating the switch means, the mechanical actuator, in a first position thereof, causing switching of the switch means to the first state and, in a position thereof, causing switching of the switch means to the second state thereof. An important aspect of the inventions involves the provision of means responsive to movement of mechanical actuator for controlling the sequencing rate of said electronic sequencing means. The mechanical actuator advantageously comprises a push-button actuator, and rotation of the push-button actuator is used to control the rate of sequencing of said electronic sequencing means.

A further important feature of the invention concerns the provision of error correcting means responsive to the single switch means for enabling correction of unwanted entries into the calculator means. In a preferred embodiment, the error correcting means includes means responsive to actuation of the switch means to one of the states thereof twice during a predetermined time interval for enabling correction of the last entry into the calculator means.

As noted above, the data operations include language translation and the switch means can be located remotely with respect to said display. Further, the switch means can comprise a switch device operated by minute uniaxial displacement.

Other features and advantages of the invention will be set forth in, or apparent from, the detailed description of the preferred embodiments which follows.

DETAILED DESCRIPTION OF THE PREFERRED EMBODIMENTS

Figure 1:
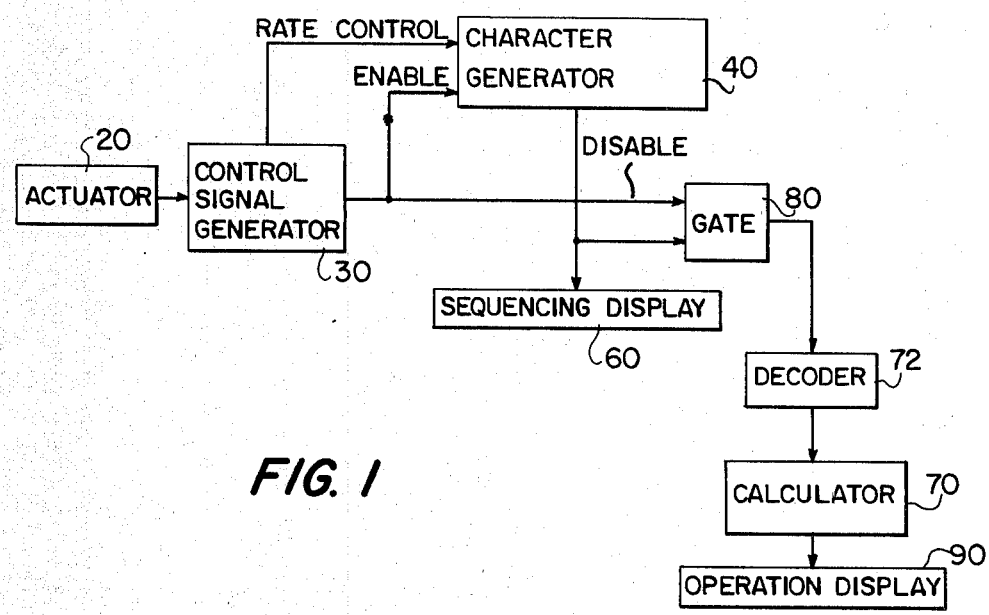
FIG. 1 is a schematic block diagram of the basic components of a first embodiment of a minicomputer constructed in accordance with the present invention.

Referring to FIG. 1, a first embodiment of a "one button" minicomputer constructed in accordance with the present invention basically comprises a single actuator 20 operable by an operator, a control signal generator 30 responsive to the operation of actuator 20 for producing at least one control signal, a character generator 40 responsive to the output of generator 30 for sequentially generating electrical signals corresponding to data and data operator information, a sequencing display device 60 connected to character generator 40 for displaying the present output thereof, a calculator 70 for processing data inputs in accordance with data operator inputs, a gate 80 responsive to the output of generator 30 for connecting the output of character generator 40 to calculator 70, and an operation display 90 for displaying the output of calculator 90.

Figure 2:
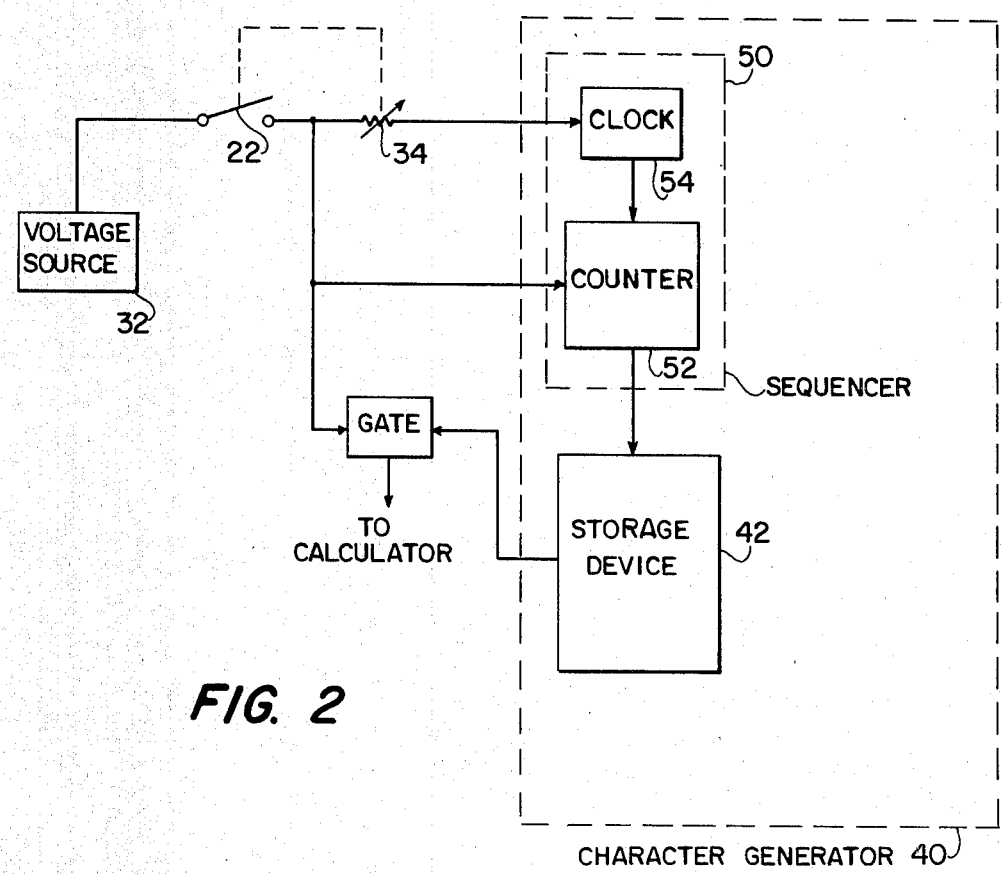
FIG. 2 is a schematic block diagram of preferred embodiments of components illustrated in FIG. 1.

Actuator 20 advantageously is configured for simplicity of operation by an operator. As is schematically shown in FIG. 2, actuator 20 preferably comprises a conventional electrical switch 22 which may be manually switched between first and second electrical states. Switch 22 advantageously may be of the type which is mechanically actuated by a button or other structural member (not shown) which is displaceable between first and second positions corresponding to the two electrical states of the switch. Alternatively, switch 22 advantageously may be an electronically actuated type of switch, such as a conventional capacitive or heat-sensitive switch (not shown) wherein contact with a sensor element by an operator causes the switch to change state. In addition, actuator 20 may readily further comprise conventional sensing and transducing circuitry (not shown) to allow actuator 20 to be responsive to various stimuli, such as light and sound, or to be responsive to electrical signals. The particular embodiment of the invention selected will, of course, depend on a number of factors. For example, a mechanically-actuated embodiment of actuator 20 is particularly suited to an embodiment of the minicomputer of the present invention which is housed in a cylindrical housing such as that of a writing instrument, i.e., a push button pen. Where the minicomputer of the present invention is incorporated in an actual writing instrument, it is to be noted further that either the button which is used for retraction of the writing point can constitute the displaceable element of actuator 20, or the instrument can be configured such that pressure on the point itself operates actuator 20.

It will be appreciated that control signal generator 30 can take a number of conventional forms. An advantageously simple embodiment of generator 30 which minimizes the circuit components required is illustrated in FIG. 2 and comprises a voltage source 32 connected in series with switch 22 as a control input to character generator 40 and gate 80 such that the presence or absence of the voltage signal from source 32 respectively enables and disables character generator 40 and opens and closes gate 80.

Signal generator 30 advantageously further comprises circuitry for generating a variable control signal for controlling the rate at which character generator 40 generates output signals. Referring to FIG. 2, a variable resistance 34 connected to voltage source 32 via switch 22 advantageously provides the variable control signal for the embodiment of character generator 40 described hereinbelow. As will be appreciated by those of ordinary skill in the art, a conventional variable rheostat (not shown) mechanically connected in a conventional manner to a mechanically-actuated embodiment of switch 22, as is schematically indicated, such that the degree of displacement of the switch button controls the value of the resistance, advantageously constitutes resistance 34. As will be further appreciated by those of ordinary skill in the art, either a rotary or a linear rheostat may be used, such that either rotary or linear displacement of the switch button varies the resistance. In addition, switch 22 may be conventionally constructed such that either one type of button displacements e.g., linear, controls the electrical state of the switch while another type of button displacement, e.g., rotary, controls the value of resistance 34; or the same type of button displacement controls both the electrical state of the switch and the value of resistance 34.

Character generator 40 advantageously comprises a storage device 42 having the data and data operator signals stored therein at a plurality of addressable storage locations, and a sequencer 50 responsive to the generator 30 control signals for sequentially addressing the storage locations of storage device 42.

A conventional electronic memory (not shown) in which the data and data operator information are pre-stored in digitally encoded form preferably constitutes storage device 42. As will be appreciated by those of ordinary skill in the art, if the minicomputer of the present invention is to perform, for example, mathematical calculations, then the data information stored in storage device 42 advantageously comprises the numerals 0-9 and a decimal point in order that numbers of any size within the limits of the capacity of calculator 70 may be formed by successive selection of the individual numerals and decimal point, if any, in the desired number. The data operator information stored in storage device 42 for a mathematical minicomputer would include the mathematical operators, such as the arithmetic operators +, −, ×, and ÷, as well as an = operator. Similarly, if the minicomputer of the present invention is to perform, for example, language translation, the stored data information would comprise the letter characters and punctuation necessary to form the words or phrases to be translated, and the stored data operator information would include translator symbols indicating the translation operation to be performed.

Advantageously, data operator information corresponding to the "clear" and "clear entry" functions of conventional calculators is also stored in storage device 42.

For use with an electronic digital memory embodiment of storage device 42, sequencer 50 preferably comprises a conventional digital counter 52 which is incremented by a clock 54. Advantageously, counter 52 is conventionally configured such that the counter automatically resets to an initialized state following a predetermined number of counts corresponding to the number of storage locations in storage device 42. As will be appreciated by those of ordinary skill in the art, each count in counter 52 corresponds to the address of a different storage location in storage device 42. Thus, as the count in counter 52 is incremented by the action of clock 54, counter 54 produces addressing output signals which sequentially address the storage locations in storage device 42.

Clock 54 advantageously comprises a conventional voltage-controlled oscillator (not shown) or the like for providing a variable clocking rate under the control of the variable control signal produced by the preferred embodiment of generator 30 described hereinabove.

Figure 6:
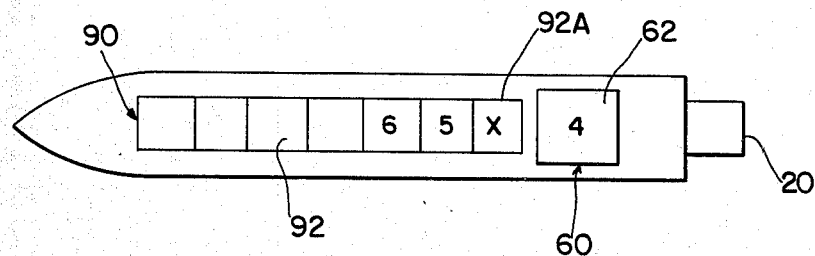
FIGS. 6 and 7 are diagrammatic representations of exemplary display configurations for the displays illustrated in FIGS. 1 and 3.
Figure 7:
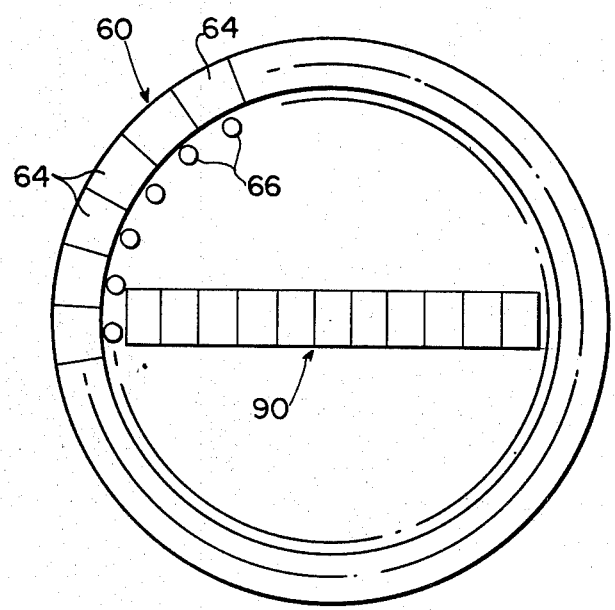

Any conventional type of display advantageously constitutes sequencing display 60 and operation display 90. Exemplary configurations of displays 60 and 90 are illustrated in FIGS. 6 and 7. In the embodiment of FIG. 6, both displays 60 and 90 comprise conventional electronic displays utilizing liquid crystal displays or other conventional character display elements, which are indicated schematically by elements 62 and 92, respectively. As will be appreciated by those of ordinary skill in the art, such displays are provided with decoding and driving circuit (not shown) for translating digitally encoded input signals representing the symbols to be displayed into corresponding sets of drive signals for energizing the character display elements. As shown in FIG. 6, display 60 advantageously has only a single character capacity (although multiple character capacity can be provided for), and displays only the present input information, while display 90 has the capacity for as many characters as is desired, and continues to display previously displayed characters as each new character is displayed by continuously shifting each character one display element to the left. Display 90 may also be provided in a conventional manner with overflow storage (not shown) and generation of an overflow indication in the left-most display element whenever the bit length of the information to be displayed exceeds the number of display elements in the display. Further, the character display element of display 60 is advantageously disposed adjacent the right-most character display element 92a of display 90, and display 90 is linearly configured such that the combined character display elements of displays 60 and 90 effectively form a continuous display, as has been indicated by the partial mathematical equation depicted within the character elements of FIG. 6. It will be appreciated by those of ordinary skill in the art that the display configuration of FIG. 6 is particularly suited for an embodiment of the minicomputer of the present invention which is housed in a cylindrical container such as a writing instrument. It will also be appreciated that display 90 may readily comprise multiple rows of character display elements, and that displays 60 and 90 may be physically implemented with a single display unit in a conventional manner.

In the embodiments of FIG. 7, display 90 comprises a conventional electronic display similar to that shown in FIG. 6. Display 60 comprises a set of geographical representations, which are schematically indicated and generally denoted 64, of information stored in storage device 42 printed, embossed or otherwise affixed to a surface of the minicomputer; a conventional electronically controlled indicator element 66 (e.g., a light emitting diode) disposed adjacent each graphical representation; and conventional decoding circuitry (not shown) connecting the output of storage device 42 to elements 66 such that the indicator elements 66 are selectively energized to indicate which one of the storage locations is being addressed.

Conventional logic gate circuitry (not shown) advantageously comprises gate 80. The circuitry preferably is configured in a conventional manner such that gate 80 is open in the presence of the voltage control signal from generator 30, and closed in the absence of the control signal.

A conventional electronic digital calculating computer advantageously comprises calculator 70. For a mathematical embodiment of the minicomputer of the present invention, any of the computing units utilized in commercially available pocket calculators is suitable. Preferably, a conventional decoder 72 is provided for routing the successive outputs of storage device 42 to the appropriate inputs of calculator 70 in dependence on whether the storage device output corresponds to a data entry or a data operator entry. As will be appreciated by those of ordinary skill in the art, calculator 70 processes the successive input signals gated by gate 80 from storage device 42 in exactly the same manner as if the signals had been generated by actuating individual switches corresponding to each data or data operator entry.

Figure 3:
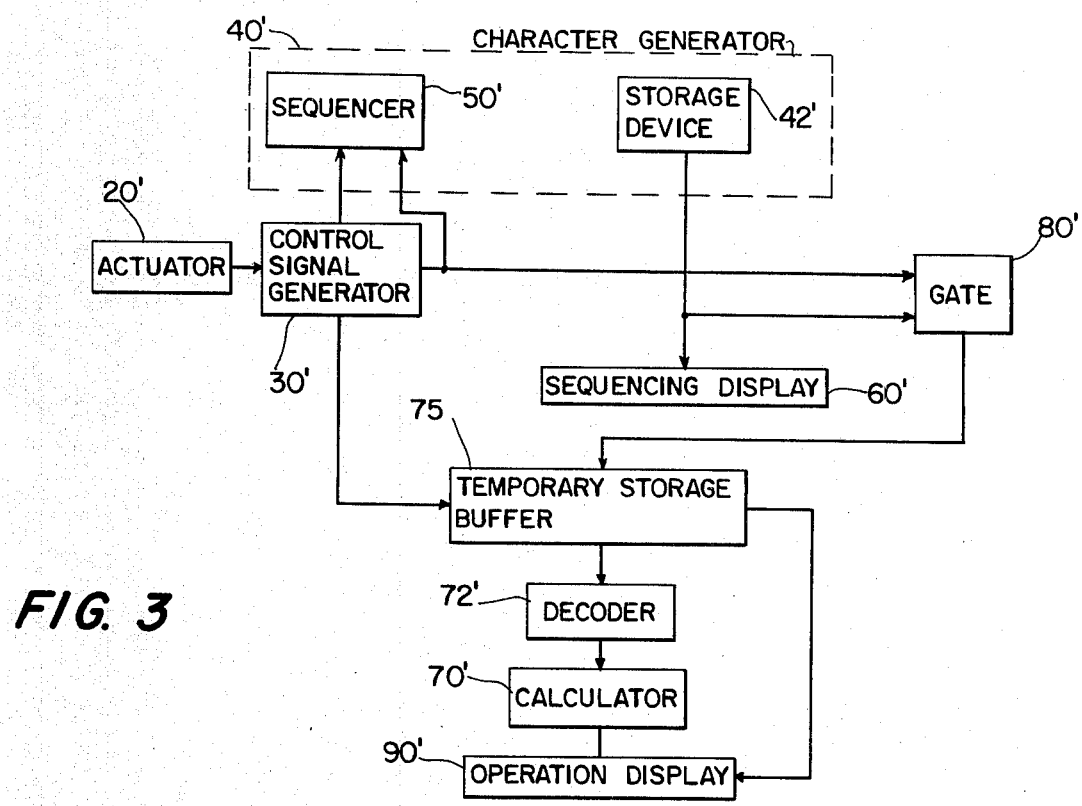
FIG. 3 is a schematic block diagram of the basic components of a second embodiment of a minicomputer constructed in accordance with the present invention having a single actuator error-correcting capability.
Figure 4:
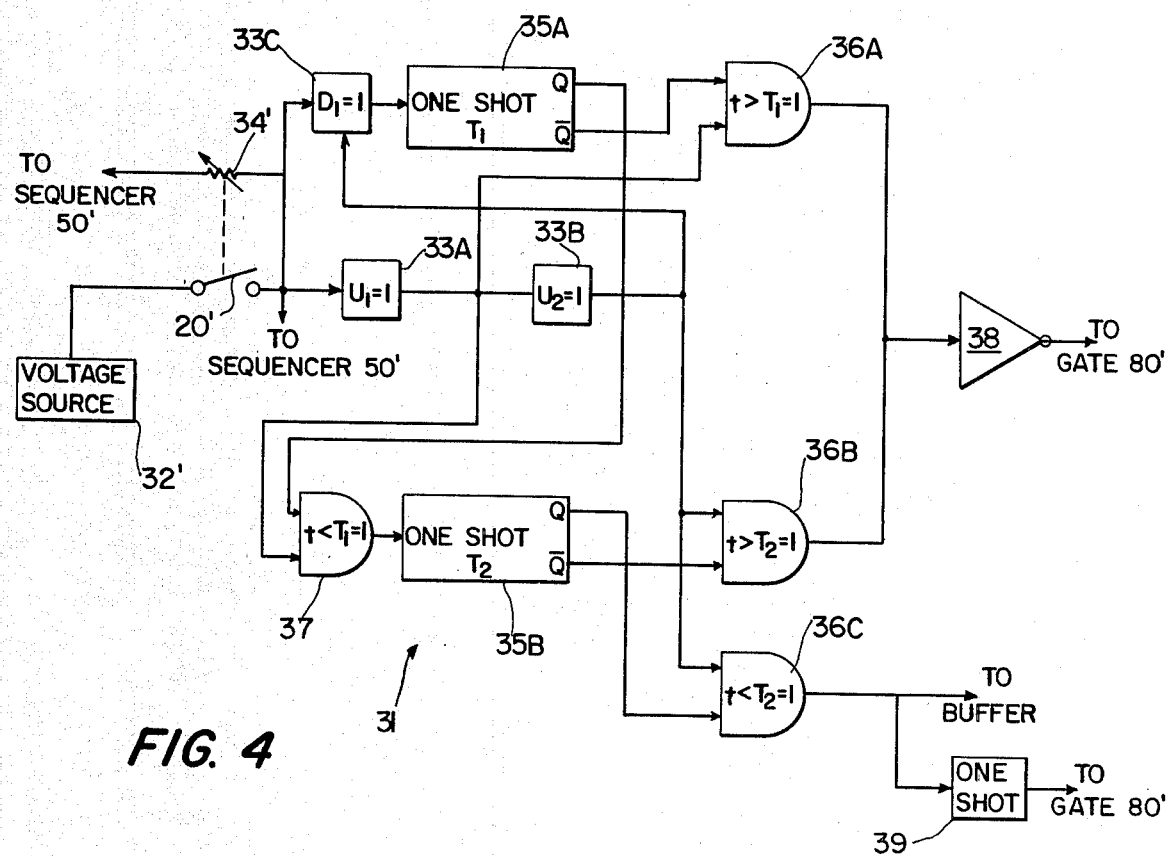
FIG. 4 is a schematic block diagram of a preferred embodiment of the control signal generator shown in FIG. 3.

Referring to FIGS. 3 and 4, an embodiment of a minicomputer constructed in accordance with the present invention will now be described which has a "one button" error correction capability. The embodiment of FIGS. 3 and 4 comprises elements which are similar to those in the embodiment of FIGS. 1 and 2, and have been denoted in the figures with the same reference numerals with primes attached. For the sake of clarity, the elements which are identical in both embodiments will not be described again here.

In order to provide error correction under the control of actuator 20', the embodiment of FIGS. 3 and 4 is provided with an electronic temporary storage buffer 75 connected between the output of gate 80' and the input to calculator 70' and decoder 72' associated therewith. Buffer 75 advantageously comprises a conventional shift register (not shown) for storing successive output signals from storage device 42' as a continuous bit string. As will be appreciated by those of ordinary skill in the art, as each new output is received, previously stored entries are shifted to new bit locations within the register. Buffer 75 advantageously further comprises conventional decoding circuitry (not shown)

for preventing the contents of buffer 75 to be sensed by decoder 72' until an "=" signal has been received, and for preserving the contents of buffer 75 following an "=" signal input until the next data or data operator output from storage device 42' has been received. The decoding circuitry is further conventionally configured such that a "clear" or "clear entry" output from storage device 42' causes the appropriate information previously stored in buffer 75 to be removed. Preferably, the output of buffer 75 is also connected to display 90' via conventional logic circuitry (not shown) such that the contents of buffer 75 are displayed on display 90' exept when an "=" signal has been received.

Error correction signals are preferably generated in accordance with the present invention by multiple successive activation of actuator 20' within a predetermined time interval. Preferably, control signal generator 30' is configured such that the gate 80 disabling control signal continues for a predetermined time interval following the actuation of actuator 20' which normally causes gate 80 to close. If actuator 20' is then successively actuated during the predetermined time interval so as to signify error correction, signal generator 30' then generates an error correcting control signal which is fed to storage buffer 75. With a shift register embodiment of buffer 75, the error correcting control signal advantageously is connected so as to cause buffer 75 to shift so as to remove the incorrect entry.

Figure 5:
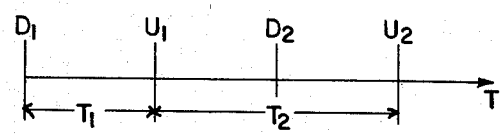
FIG. 5 is a graphical representation of the error signal generating actuation sequence used with the generator shown in FIG. 4.

Logic circuitry, generally denoted 31, is illustrated in FIG. 4 which generates an error correcting signal when actuator 20' is caused to change state four times within a predetermined total time interval, and if the first two state changes occur within a predetermined initial interval. With a mechanical switch embodiment of actuator 20', such as a push-button switch, two relatively rapid depressions of the switch, followed by a final release of the switch within the predetermined time interval, would thus be required to generate an error correcting signal. For clarity of description, notations have been included in FIG. 4 indicating when various signals are generated. Referring to FIG. 5, the initial time interval between the first two changes of state, corresponding, for example, to a first depression $D_1$ and a first release $U_1$ of a push-button switch, is denoted $T_1$. The time interval between the second two changes of state, corresponding, for example, to a second depression $D_2$ and a second release $U_2$ of a push-button switch, is denoted $T_2$.

Referring to FIG. 4, the error correcting signal generating circuitry 31 comprises voltage source 32' connected in series with actuator 20' to a series of two conventional flip-flop circuits 33A and 33B, or the like, for generating a signal when release $U_1$ has occurred and when release $U_2$ has occurred, respectively. The switched output of voltage source 32' is also connected via a further flip-flop circuit 33C, or the like, to a first one-shot multivibrator 35A or other conventional timing circuit having a time period corresponding to time interval $T_1$. Flip-flop 33C generates a signal when depression $D_1$ has occurred. The $\overline{Q}$ output of multivibrator 35A and the output of flip-flop 33A are connected to a first AND gate 36A. It will be appreciated by those of ordinary skill in the art that gate 36A will produce an output only if release $U_1$ does not occur within the predetermined initial time interval.

The Q output of multivibrator 35A and the output of flip-flop 33A are connected via an AND gate 37 to the input of a second multivibrator 35B or other conventional timing circuit having a time period corresponding to time interval $T_2$. The $\overline{Q}$ output of multivibrator 35B and the output of flip-flop 33B are connected to a second AND gate 36B. It will be appreciated that gate 36B will produce an output only if release $U_2$ does not occur within the total time interval during which the error correcting activation of activator 20' must occur.

For use of circuit 31 with the preferred embodiment of gate 80' described hereinabove, wherein gate 80' is closed in the absence of a control signal, the outputs of multivibrators 36A and 36B are connected to a NOT gate 38 which is connected to the control input of gate 80'. The Q output of multivibrator 35B and the output of flip-flop 33B are connected to the inputs of a third AND gate 36C. The output of gate 36C constitutes the error correcting signal, which is fed to storage buffer 75. The output of gate 36C is also connected to a one-shot multivibrator 39 or other conventional timing circuit for producing a control signal to disable gate 80' while the error correcting operation is carried out in buffer 75.

It will be appreciated from the foregoing by those of ordinary skill in the art that an unwanted character entry can be readily and simply removed from buffer 75 simply by multiple actuation of actuator 20' within the predetermined time intervals. It will be further appreciated that previous character entries can also be removed from storage simply by repeating the error signal generating actuation sequence of actuator 20'.

Although the invention has been described in relation to exemplary embodiments thereof, it will be understood by those skilled in the art that variations and modifications can be effected in these exemplary embodiments without departing from the scope and spirit of the invention.

I claim:

1. A single actuator electronic digital calculator device, comprising a display, electronic sequencing means for providing sequencing of the display through a plurality of characters representing both data and data operations, a digital calculator means for processing data signals in accordance with data operator signals, and a single switch means controlled by the operator of the device for, in a first state thereof, actuating said electronic sequencing means so as to provide sequencing of said display and for, in a second state thereof, deactivating said sequencing means to provide selection of a said character and for causing entry of a digitally encoded signal representing the selected character into said calculator means, said electronic sequencing means comprising character generator means for, when actuated, generating a said plurality of characters on a continuous, cyclic basis, and said display comprising an electronic display means, responsive to said character generator means, for displaying said characters in sequence on a continuous cyclic basis when said character generator means is actuated, said device further comprising a single actuator for actuating said switch means, said actuator, in a first state thereof, causing switching of said switch means to the first state of said switch means and, in a second state thereof, causing switching of said switch means to said second state of said switch means, and means responsive to said single actuator for controlling the sequencing rate of said electronic sequencing means over a continuous spectrum of rates.

2. A calculator device as claimed in claim 1 wherein said calculator means includes a separate plural character display and wherein said electronic display means includes a further character display disposed on said calculator device adjacent said plural character display.

3. A calculator device as claimed in claim 1 wherein said actuator comprises a push-button actuator, and rotation of said push-button actuator controls the rate of sequencing of said electronic sequencing means.

4. A calculator device as claimed in claim 1 further comprising error correcting means responsive to said single switch means for enabling correction of unwanted entries into said calculator means.

5. A calculator device as claimed in claim 4, wherein said error correcting means includes means responsive to actuation at any time after the last character entry of said switch means to one of the states thereof twice during a predetermined time interval for enabling correction of the last entry into said calculator means.

6. A calculator device as claimed in claim 1 wherein said data operations include language translation.

7. A calculator device as claimed in claim 1 where said switch means is located remotely with respect to said display.

8. A calculator device as claimed in claim 1 wherein said switch means comprises a switch device operated by minute uniaxial displacement.

9. A calculator device as claimed in claim 1 wherein said device is incorporated in a writing implement and wherein said selection of a said character occurs simultaneously with the use of said writing implement.

10. A calculator device as claimed in claim 1 wherein said calculator means includes a separate plural character display and wherein said electronic display means includes a further character display for a least single characters remote from said plural character display.

* * * * *